US006806556B2

(12) United States Patent
Ohara (10) Patent No.: US 6,806,556 B2
(45) Date of Patent: Oct. 19, 2004

(54) SEMICONDUCTOR WAFER, METHOD OF MANUFACTURING SEMICONDUCTOR WAFER HAVING BUMPS, SEMICONDUCTOR CHIP HAVING BUMPS AND METHOD OF MANUFACTURING THE SAME, SEMICONDUCTOR DEVICE, CIRCUIT BOARD, AND ELECTRONIC EQUIPMENT (75) Inventor: Hiroshi Ohara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/268,835

(22) Filed: Oct. 11, 2002

(65) Prior Publication Data
US 2003/0080422 A1 May 1, 2003

(30) Foreign Application Priority Data
Oct. 25, 2001 (JP) ..... 2001-327239
Aug. 19, 2002 (JP) ..... 2002-238017

(51) Int. Cl.⁷ ..... H01L 23/544; H01L 23/48
(52) U.S. Cl. ..... 257/620; 257/738; 257/778; 257/786
(58) Field of Search ..... 257/620, 670, 257/672, 673, 692, 693, 700, 737, 738, 778–781, 786; 438/107, 109–111, 113, 114, 458, 460, 462, 464

(56) References Cited
U.S. PATENT DOCUMENTS
6,535,398 B1 * 3/2003 Moresco ..... 361/792
* cited by examiner Primary Examiner—Hung Vu
(74) Attorney, Agent, or Firm—Oliff & Berridge, PLC (57) ABSTRACT A semiconductor wafer includes a plurality of monolithic integrated circuits formed in a semiconductor crystal for realizing a function of a plurality of semiconductor chips; a plurality of pads formed in a plurality of first regions to be the plurality of semiconductor chips; and a conductor formed in a layer lower than the pads through a second region, which is located between two of the first regions, and electrically connecting at least two of the pads.

3 Claims, 12 Drawing Sheets

PRIOR ART

SEMICONDUCTOR WAFER, METHOD OF MANUFACTURING SEMICONDUCTOR WAFER HAVING BUMPS, SEMICONDUCTOR CHIP HAVING BUMPS AND METHOD OF MANUFACTURING THE SAME, SEMICONDUCTOR DEVICE, CIRCUIT BOARD, AND ELECTRONIC EQUIPMENT

Japanese Patent Application No. 2001-327239 filed on Oct. 25, 2001 and Japanese Patent Application No. 2002-238017 filed on Aug. 19, 2002, are hereby incorporated by reference in their entirety.

BACKGROUND OF THE INVENTION

The present invention relates to a semiconductor wafer, a method of manufacturing a semiconductor wafer having bumps, a semiconductor chip having bumps and a method of manufacturing the same, a semiconductor device, a circuit board, and electronic equipment.

As the degree of integration of a semiconductor integrated circuit is increased and the size of a semiconductor chip is decreased, mounting technology capable of connecting terminals at a minute pitch has been demanded. As examples of mounting technology capable of easily dealing with such a demand, TAB (Tape Automated Bonding) mounting used for a TCP (Tape Carrier Package) and flip-chip mounting used for a CSP (Chip Size Package) can be given.

In the above mounting technology, bumps are generally formed on pads of the semiconductor chip. Au bumps are typically used as the bumps and generally formed by electroplating. A method of forming Au bump electrodes by electroplating is described below.

Figure 16:
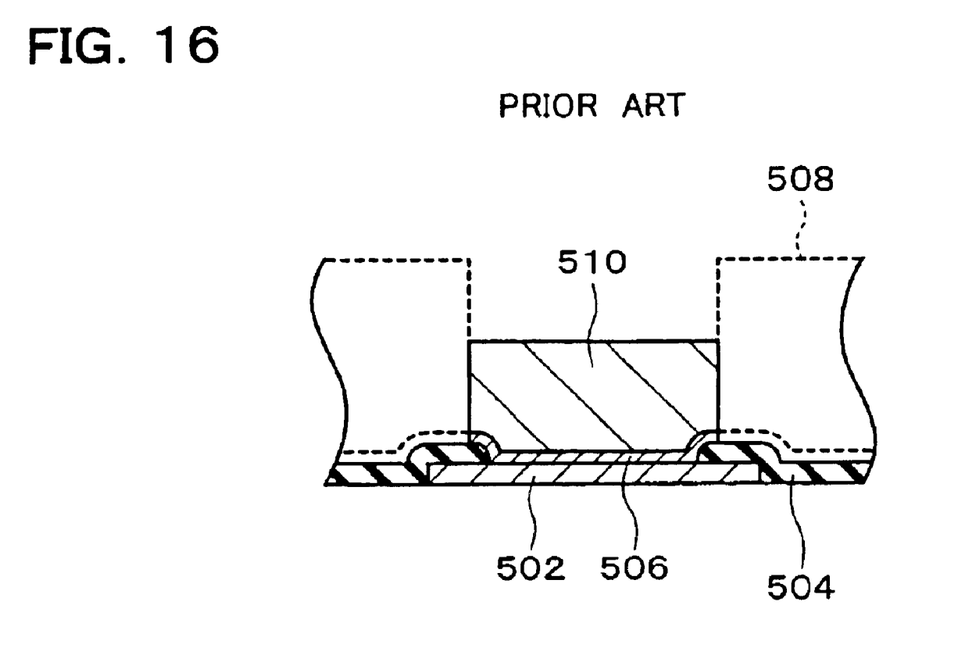
FIG. 16 illustrates prior art of the present invention.

FIG. 16 is a cross-sectional view showing an Au bump in a conventional semiconductor chip. A pad 502, which is part of an interconnect linked with an inner integrated circuit, is covered with a passivation film 504 excluding the surface of an electrical connection region.

An under-bump metal layer (laminate of a barrier metal layer and an adhesive metal layer) 506 is formed by using a sputtering method. A resist layer 508 for forming bumps which exposes the electrical connection region of the pad 502 and its peripheral region is formed by using photolithographic technology. Au is grown by electroplating corresponding to the pattern of the resist layer 508. After removing the resist layer 508, the under-bump metal layer 506 is wet-etched corresponding to the type of the under-bump metal layer 506 using the grown Au as a mask. A bump 510 is formed by subsequent annealing and the like. A cleaning step is appropriately performed during the process. Since bump formation by electroplating is a long process, further reduction and rationalization of the process are demanded.

To deal with this demand, formation of bumps by electroless plating has been proposed. If the bumps are formed by electroless plating, it is unnecessary to perform at least the step of forming the under-bump metal layer by sputtering and the step of etching the under-bump metal layer. Moreover, it is expected that formation of a resist for growth of plating can be omitted. This enables the process to be significantly reduced, whereby the bumps are formed at low cost.

Conventionally, aluminum pads are subjected to a zincate treatment as a pretreatment for plating when forming the bumps by electroless plating. Specifically, a semiconductor wafer is immersed in a treatment solution including Zn ions, whereby the surface of the pads is replaced by Zn according to the reaction shown by $2Al+3Zn^{2+} \rightarrow 2Al^{3+}+3Zn$. The entire semiconductor wafer is then immersed in a plating solution (treatment solution for plating), thereby causing a plating metal to be deposited. The process maybe rationalized by batch processing in which a plurality of semiconductor wafers is immersed in the plating solution.

The aluminum pads which become GND electrodes are electrically connected with an Si substrate of the semiconductor wafer. The Si substrate is electrically connected with the treatment solution. When electrons in the Si substrate are released into the treatment solution, the potential of the aluminum pads is changed. Since the amount of electrons used for a chemical reaction is decreased by such a grounding effect, ionic bonding rarely occurs, whereby replacement of the surface of the aluminum pads by Zn is insufficient in the zincate treatment. Moreover, the plating rate is changed by the grounding effect, whereby deposition of the plating metal is affected.

There is a case where a considerable amount of resist is thickly applied to the back side and a region near the periphery (from the periphery of the surface to the side) of the semiconductor wafer in order to prevent influence of the grounding effect. The zincate treatment and the plating treatment are performed while preventing the plating solution from coming in contact with a region near the periphery and the back side of the semiconductor wafer in this manner.

A resist is applied to the back side of the semiconductor wafer while chucking (absorbing under vacuum) the side on which the bumps are formed (main surface of the semiconductor wafer) on a rotating table of a spin coater. In this case, the bump formation side must be prevented from being damaged so that the subsequent growth of plating is not affected. Since the deposition and growth of the plating metal is determined corresponding to the potential of a region with which the pads are electrically connected, even if the resist is applied to the back side of the semiconductor wafer, it is difficult to form bumps having a uniform height by high-quality electroless plating.

BRIEF SUMMARY OF THE INVENTION

A semiconductor wafer according to a first aspect of the present invention comprises:

a plurality of monolithic integrated circuits formed in a semiconductor crystal for realizing a function of a plurality of semiconductor chips;

a plurality of pads formed in a plurality of first regions to be the plurality of semiconductor chips; and a conductor formed in a layer lower than the pads through a second region, which is located between two of the first regions, and electrically connecting at least two of the pads.

A semiconductor wafer according to a second aspect of the present invention comprises:

a plurality of monolithic integrated circuits formed in a semiconductor crystal for realizing a function of a plurality of semiconductor chips;

a plurality of pads formed in a plurality of first regions to be the plurality of semiconductor chips; and a conductive film formed on the pads through a second region, which is located between two of the first regions, and electrically connecting at least two of the pads, wherein the conductive film is formed so that the at least two of the pads are electrically isolated when a portion of the conductive film in the second region is removed.

A method of manufacturing a semiconductor wafer having bumps according to a third aspect of the present invention comprises:

forming the bumps by electroless plating on respective pads of a semiconductor wafer having a plurality of monolithic integrated circuits formed in a semiconductor crystal for realizing a function of a plurality of semiconductor chips, wherein the plurality of pads is formed in a plurality of first regions to be the plurality of semiconductor chips, and wherein the electroless plating is performed in a state in which at least two of the pads are electrically connected by a conductor formed in a layer lower than the pads through a second region, which is located between two of the first regions.

A method of manufacturing a semiconductor wafer having bumps according to a fourth aspect of the present invention comprises:

forming a conductive film on a plurality of pads of a semiconductor wafer having a plurality of monolithic integrated circuits formed in a semiconductor crystal for realizing a function of a plurality of semiconductor chips so as to electrically connect at least two of the pads; and forming bumps on the conductive film in a region over each of the pads by electroless plating.

A method of manufacturing a semiconductor chip having bumps according to a fifth aspect of the present invention comprises cutting a semiconductor wafer, wherein the semiconductor wafer includes:

a plurality of monolithic integrated circuits formed in a semiconductor crystal for realizing a function of a plurality of semiconductor chips;

a plurality of pads formed in a plurality of first regions to be the plurality of semiconductor chips;

a conductor formed in a layer lower than the pads through a second region, which is located between two of the first regions, and electrically connecting at least two of the pads; and bumps formed on at least two of the electrically connected pads, respectively, and wherein the semiconductor wafer is cut along the second region.

A method of manufacturing a semiconductor chip having bumps according to a sixth aspect of the present invention comprises cutting a semiconductor wafer, wherein the semiconductor wafer includes:

a plurality of monolithic integrated circuits formed in a semiconductor crystal for realizing a function of a plurality of semiconductor chips;

a plurality of pads formed in a plurality of first regions to be the plurality of semiconductor chips;

a conductive film formed on the pads through a second region, which is located between two of the first regions, and electrically connecting at least two of the pads; and bumps formed on the conductive film in a region over the respective pads, and wherein the semiconductor wafer is cut along the second region.

A semiconductor chip having bumps according to a seventh aspect of the present invention is manufactured by using the above method.

A semiconductor device according to an eight aspect of the present invention comprises:

the above semiconductor chip having bumps;

a substrate on which the semiconductor chip having the bumps is mounted; and external terminals.

A circuit board according to a ninth aspect of the present invention includes the above semiconductor chip having bumps mounted on the circuit board.

A circuit board according to a tenth aspect of the present invention includes the above semiconductor device mounted on the circuit board.

Electronic equipment according to an eleventh aspect of the present invention comprises the above semiconductor device.

DETAILED DESCRIPTION OF THE EMBODIMENT

Embodiments of the present invention may enable high-quality electroless plating for a semiconductor wafer, a method of manufacturing a semiconductor wafer having bumps, a semiconductor chip having bumps and a method of manufacturing the same, a semiconductor device, a circuit board, and electronic equipment.

(1) A semiconductor wafer according to an embodiment of the present invention comprises:

a plurality of monolithic integrated circuits formed in a semiconductor crystal for realizing a function of a plurality of semiconductor chips;

a plurality of pads formed in a plurality of first regions to be the plurality of semiconductor chips; and a conductor formed in a layer lower than the pads through a second region, which is located between two of the first regions, and electrically connecting at least two of the pads.

According to this embodiment of the present invention, since at least two of the pads are electrically connected, there is no or only a small potential difference between the pads. Therefore, high-quality electroless plating can be performed.

(2) In this semiconductor wafer, a first pad among a plurality of the pads may be electrically connected with an element of each of the monolithic integrated circuits through a first path, and a second pad among a plurality of the pads may be electrically connected with the semiconductor crystal through a second path which avoids the monolithic integrated circuits, and the conductor may electrically connect the first path and the second path.

(3) This semiconductor wafer may further comprise:

an impurity diffusion region which is formed in the semiconductor crystal and has a conductivity type opposite to the semiconductor crystal, the conductor may be electrically connected with the impurity diffusion region so as to avoid a portion of the semiconductor crystal other than the impurity diffusion region.

(4) This semiconductor wafer may further comprise:

an electric insulator formed over the semiconductor crystal, and the conductor and the semiconductor crystal may be electrically insulated by the electric insulator.

(5) In this semiconductor wafer, the second region may be a cutting line.

(6) In this semiconductor wafer, the conductor may be formed so that the at least two of the pads are electrically isolated when a portion of the conductor in the second region is removed.

(7) In this semiconductor wafer, the conductor may have a branch section connected with each of at least two of the electrically connected pads in the second region.

(8) In this semiconductor wafer, the conductor may have a first part and a plurality of second parts, the first part may be formed along and inside the second region so as to enclose each of the first regions, and each of the second parts may electrically connect a pair of the pads adjacent across the second region and may be electrically connected with the first part.

(9) This semiconductor wafer may further comprise bumps formed on at least two of the electrically connected pads, respectively.

(10) A semiconductor wafer according to another embodiment of the present invention comprises:

a plurality of monolithic integrated circuits formed in a semiconductor crystal for realizing a function of a plurality of semiconductor chips;

a plurality of pads formed in a plurality of first regions to be the plurality of semiconductor chips; and a conductive film formed on the pads through a second region, which is located between two of the first regions, and electrically connecting at least two of the pads, wherein the conductive film is formed so that the at least two of the pads are electrically isolated when a portion of the conductive film in the second region is removed.

According to this embodiment of the present invention, since at least two of the pads are electrically connected, there is no or only a small potential difference between the pads. Therefore, high-quality electroless plating can be performed.

(11) In this semiconductor wafer, the conductive film may have a branch section connected with each of the at least two of the electrically connected pads in the second region.

(12) In this semiconductor wafer, the conductive film may have a first part and a plurality of second parts, the first part may be formed along and inside the second region so as to enclose each of the first regions, and each of the second parts may electrically connect a pair of the pads adjacent across the second region and may be electrically connected with the first part.

(13) This semiconductor wafer may further comprise bumps formed on the conductive film in a region over the respective pads.

(14) A method of manufacturing a semiconductor wafer having bumps according to another embodiment of the present invention comprises:

forming the bumps by electroless plating on respective pads of a semiconductor wafer having a plurality of monolithic integrated circuits formed in a semiconductor crystal for realizing a function of a plurality of semiconductor chips, wherein the plurality of pads is formed in a plurality of first regions to be the plurality of semiconductor chips, and wherein the electroless plating is performed in a state in which at least two of the pads are electrically connected by a conductor formed in a layer lower than the pads through a second region, which is located between two of the first regions.

According to this embodiment of the present invention, since at least two of the pads are electrically connected, there is no or only a small potential difference between the pads. Therefore, high-quality electroless plating can be performed.

(15) In this method of manufacturing a semiconductor wafer having bumps, the conductor may be formed so that the at least two of the pads are electrically isolated when a portion of the conductor in the second region is removed.

(16) A method of manufacturing a semiconductor wafer having bumps according to another embodiment of the present invention comprises:

forming a conductive film on a plurality of pads of a semiconductor wafer having a plurality of monolithic integrated circuits formed in a semiconductor crystal for realizing a function of a plurality of semiconductor chips so as to electrically connect at least two of the pads; and forming bumps on the conductive film in a region over each of the pads by electroless plating.

According to this embodiment of the present invention, since at least two of the pads are electrically connected, there is no or only a small potential difference between the pads. Therefore, high-quality electroless plating can be performed.

(17) In this method of manufacturing a semiconductor wafer having bumps, the conductive film may by formed so that the at least two of the pads are electrically isolated when a portion of the conductive film in the second region is removed.

(18) A method of manufacturing a semiconductor chip having bumps according to another embodiment of the present invention comprises cutting a semiconductor wafer, wherein the semiconductor wafer includes:

a plurality of monolithic integrated circuits formed in a semiconductor crystal for realizing a function of a plurality of semiconductor chips;

a plurality of pads formed in a plurality of first regions to be the plurality of semiconductor chips;

a conductor formed in a layer lower than the pads through a second region, which is located between two of the first regions, and electrically connecting at least two of the pads; and bumps formed on at least two of the electrically connected pads, respectively, and wherein the semiconductor wafer is cut along the second region.

According to this embodiment of the present invention, since at least two of the pads are electrically connected, there is no or only a small potential difference between the pads. Therefore, high-quality electroless plating can be performed.

(19) In this method of manufacturing a semiconductor chip having bumps, a portion of the conductor in the second region may be removed by cutting the second region when cutting the semiconductor wafer.

(20) In this method of manufacturing a semiconductor chip having bumps, electrical connection between at least two of the pads by the conductor may be cut by cutting the semiconductor wafer.

(21) A method of manufacturing a semiconductor chip having bumps according to another embodiment of the present invention comprises cutting a semiconductor wafer, wherein the semiconductor wafer includes:

a plurality of monolithic integrated circuits formed in a semiconductor crystal for realizing a function of a plurality of semiconductor chips;

a plurality of pads formed in a plurality of first regions to be the plurality of semiconductor chips;

a conductive film formed on the pads through a second region, which is located between two of the first regions, and electrically connecting at least two of the pads; and bumps formed on the conductive film in a region over the respective pads, and wherein the semiconductor wafer is cut along the second region.

According to this embodiment of the present invention, since at least two of the pads are electrically connected, there is no or only a small potential difference between the pads. Therefore, high-quality electroless plating can be performed.

(22) In this method of manufacturing a semiconductor chip having bumps, a portion of the conductive film in the second region may be removed by cutting the second region when cutting the semiconductor wafer.

(23) In this method of manufacturing a semiconductor chip having bumps, electrical connection between at least two of the pads by the conductive film may be cut by cutting the semiconductor wafer.

(24) A semiconductor chip having bumps according to another embodiment of the present invention is manufactured by using the above method.

(25) A semiconductor device according to another embodiment of the present invention comprises:

the above semiconductor chip having bumps;

a substrate on which the semiconductor chip having the bumps is mounted; and external terminals.

(26) A circuit board according to another embodiment of the present invention includes the above semiconductor chip having bumps mounted on the circuit board.

(27) A circuit board according to another embodiment of the present invention includes the above semiconductor device mounted on the circuit board.

(28) Electronic equipment according to yet another embodiment of the present invention comprises the above semiconductor device.

Embodiments of the present invention are described below with reference to the drawings.

First Embodiment

Figure 1:
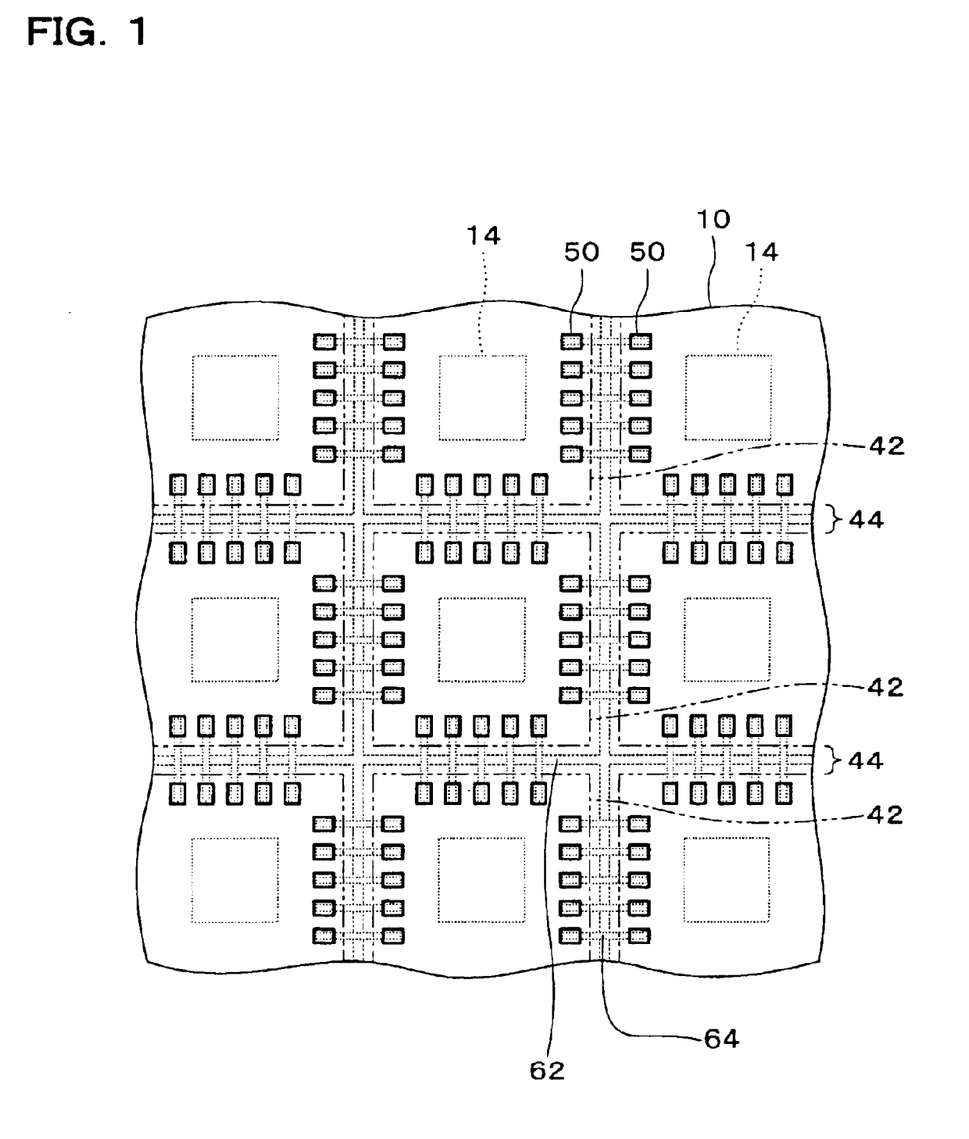
FIG. 1 is a plan view showing part of a semiconductor wafer according to a first embodiment of the present invention.
Figure 2:
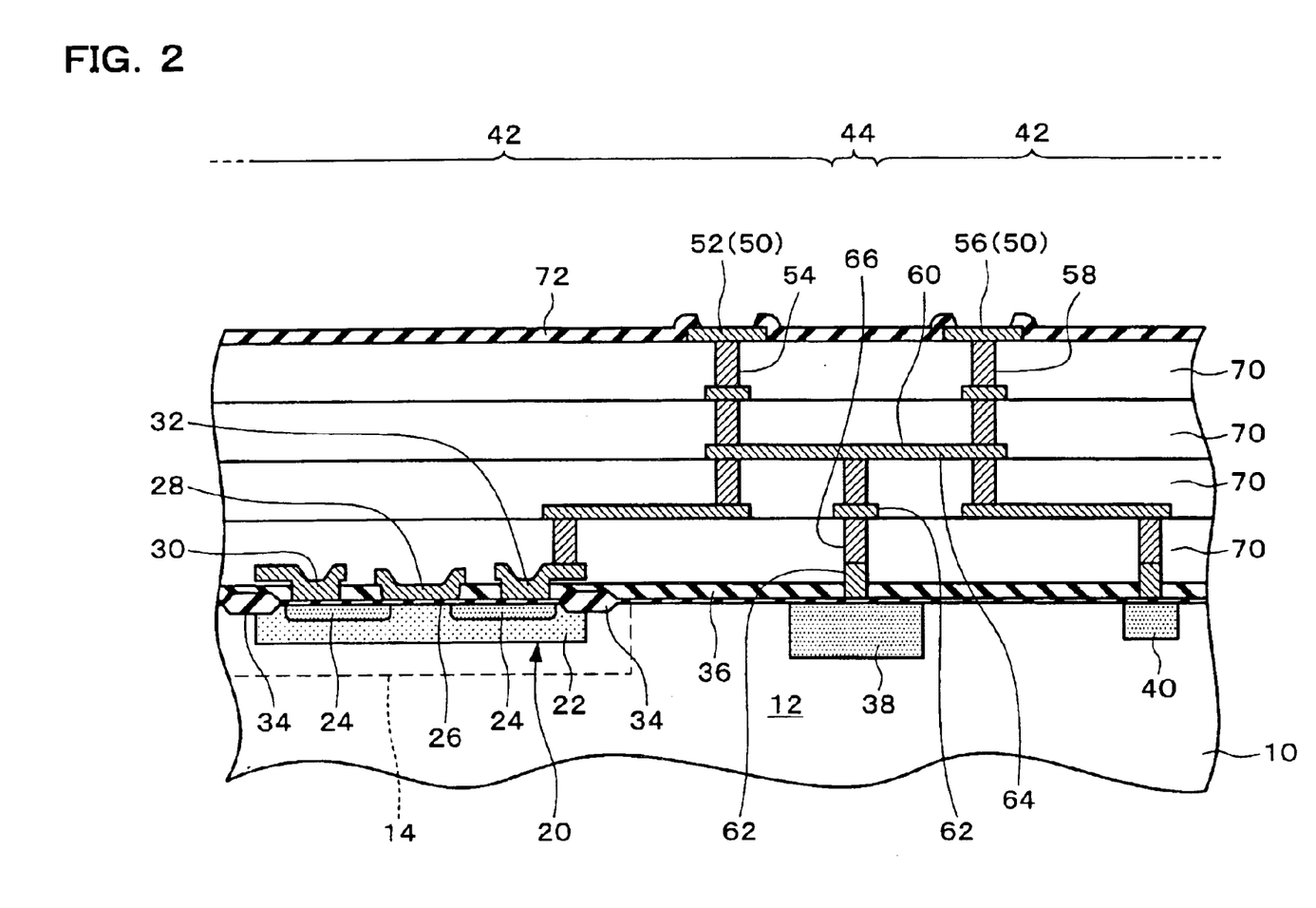
FIG. 2 is a cross-sectional view showing part of the semiconductor wafer according to the first embodiment of the present invention.

FIG. 1 is a plan view showing part of a semiconductor wafer according to a first embodiment of the present invention. FIG. 2 is a cross-sectional view showing part of the semiconductor wafer according to the first embodiment of the present invention.

A semiconductor wafer 10 is cut (diced or scribed, for example) into a plurality of semiconductor chips. A semiconductor wafer 10 includes a semiconductor crystal (Si substrate, for example) 12. The semiconductor crystal 12 is doped with impurities and shows an n-type or p-type conductivity. A plurality of monolithic integrated circuits 14 is formed in the semiconductor crystal 12. Each of the monolithic integrated circuits 14 realizes a function of a semiconductor chip.

FIG. 2 shows a MOS transistor 20 as one of elements of the monolithic integrated circuit 14. In more detail, a well 22 is formed in the semiconductor crystal 12. The well 22 shows a conductivity opposite to the conductivity type of the semiconductor crystal 12. A pair of diffusion regions 24 is formed in the well 22 at an interval. One of the pair of diffusion regions 24 is a source region and the other is a drain region. The diffusion regions 24 has a conductivity type opposite to that of the well 22. An insulating film (oxide film such as $SiO_2$, for example) 26 is formed on the well 22. A first electrode (gate electrode) 28 is formed on the insulating film 26 between the pair of diffusion regions 24. A second electrode (source electrode) 30 is formed on one of the pair of diffusion regions 24. A third electrode (drain electrode) 32 is formed on the other diffusion region 24. The diffusion regions 24 are regions into which impurities are introduced. The impurities may be introduced by using a thermal diffusion process or ion implantation.

One element is electrically insulated from other elements by element isolation regions 34. The element isolation regions 34 may be formed by applying the Local Oxidation of Silicon (LOCOS). For example, thick sections of the insulating film 26 formed on the well 22 may be the element isolation regions 34. An insulating film 36 may be formed on the insulating film 26.

An impurity diffusion region 38 may be formed in the semiconductor crystal 12. The impurity diffusion region 38 is electrically insulated from a region outside the impurity diffusion region 38. The impurity diffusion region 38 may have a conductivity type opposite to that of the semiconductor crystal 12. In this case, current scarcely flows between the semiconductor crystal 12 and the impurity diffusion region 38 because a depletion layer is formed between the impurity diffusion region 38 and a region outside the impurity diffusion region 38 and the like. The impurity diffusion region 38 may be formed only in a second region 44 described later. In the example shown in FIG. 2, the impurity diffusion region 38 is formed to reach the ends of first regions 42 across the second region 44. The impurity diffusion region 38 may be a guard ring.

An impurity diffusion region 40 electrically connected with the semiconductor crystal 12 may be formed in the semiconductor crystal 12. The impurity diffusion region 40 may show the same conductivity type as the semiconductor crystal 12. In this case, current easily flows between the semiconductor crystal 12 and the impurity diffusion region 40. The impurity diffusion regions 38 and 40 are regions into which impurities are introduced. The impurities may be introduced by using a thermal diffusion process or ion implantation.

The semiconductor wafer 10 has a plurality of first regions 42 for a plurality of semiconductor chips, and the second region 44 between two (adjacent, for example) first regions 42. The second region 44 may be a cutting line. The second region 44 may enclose each of the first regions 42. The structures in all the first regions 42 may be the same at least in terms of design.

The semiconductor wafer 10 includes a plurality of pads 50. The pads 50 may be formed of aluminum. The pads 50 are formed in the first regions 42. As shown in FIG. 2, a first pad 52 among a plurality of the pads 50 is electrically connected with the element (MOS transistor 20, for example) of the monolithic integrated circuit 14. A first path 54 for electrically connecting the first pad 52 may include a contact layer (including via and plug) for securing electrical connection in the direction of the depth or height, and an interconnect for securing electrical connection in the lateral direction. A group of first pads 52 may be formed in one first region 42.

As shown in FIG. 2, a second pad 56 among a plurality of the pads 50 is electrically connected with the semiconductor crystal 12 through a second path 58 which avoids the monolithic integrated circuit 14. For example, the second path 58 may be electrically connected with the impurity diffusion region 40 having the same conductivity type as the semiconductor crystal 12. Current easily flows between the second path 58 and the semiconductor crystal 12 by the impurity diffusion region 40. Both the first pad 52 and the second pad 56 may be formed in one first region 42. The structures in all the first regions 42 may be the same at least in terms of design.

The semiconductor wafer 10 includes a conductor 60 which electrically connects at least two of the pads 50. The conductor 60 is located in a layer lower than the pads 50. The conductor 60 electrically connects the first path 54 and the second path 58. The conductor 60 passes through the second region 44 between two first regions 42. If the semiconductor wafer 10 is cut in the second region 44, part of the conductor 60 is exposed on the section of the semiconductor wafer 10. If a path line which connects the exposed surface and the pads 50 is long, migration to the pads 50 can be prevented. Therefore, other members (insulating layers 70, for example) may be interposed between a part (second part 64, for example) of the conductor 60 which passes through the second region 44 and the pads 50.

The conductor (interconnect pattern, for example) 60 has a first part (common interconnect, for example) 62. As shown in FIG. 1, the first part 62 is formed to enclose each of the first regions 42. The first part 62 is formed along and inside the second region 44. The conductor 60 has a plurality of second parts (connection paths, for example) 64. Each of the second parts 64 electrically connects a pair of pads 50 (pads 52 and 56 shown in FIG. 2, for example) adjacent across the second region 44. Each of the second parts 64 is electrically connected with the first part 62. A contact layer (including via and plug) may be used for electrical connection between the second part 64 and the first part 62.

The conductor 60 may be formed so that at least two of the pads 50 (pads 52 and 56 shown in FIG. 2, for example) are electrically isolated when the portion in the second region 44 is cut. In the example shown in FIG. 2, the first part 62 is located in the second region 44 and part of the second part 64 is located in the second region 44. The conductor 60 may have branched sections 66 connected with at least two of the electrically connected pads 50 in the second region 44. At least two of the pads 50 (pads 52 and 56 shown in FIG. 2, for example) are electrically isolated when the branched section 66 is removed.

The conductor 60 may be electrically insulated from the semiconductor crystal 12. For example, the conductor 60 may be electrically connected with the impurity diffusion region 38 having a conductivity opposite to the conductivity type of the semiconductor crystal 12. Current rarely flows between the conductor 60 and the impurity diffusion region 38 for the reason that a depletion layer is formed between the impurity diffusion region 38 and a region outside the impurity diffusion region 38 and the like. In this case, the conductor 60 is formed to avoid a region of the semiconductor crystal 12 other than the impurity diffusion region 38. An electrical connection section (third part, for example) 68 of the conductor 60 with the impurity diffusion region 38 may be a contact layer (including via and plug).

The conductor 60 is formed of either a single layer or a plurality (in the example shown in FIG. 2) of insulating layers 70. The conductor 60 may include an interconnect formed between a plurality of the insulating layers 70 and a contact layer (including via and plug) formed in a contact hole (including via hole) formed through the insulating layers 70.

The semiconductor wafer 10 includes a passivation film 72. The passivation film 72 is formed to avoid at least the center of each pad 50. The passivation film 72 may cover the end (periphery, for example) of each pad 50. Differing from the example shown in FIG. 2, the passivation film 72 may be formed to avoid a portion on a line for cutting the semiconductor wafer 10 (dicing line or scribing line, for example). The passivation film 72 may be formed of $SiO_2$, SiN, or a resin such as polyimide. The passivation film 72 may be formed of a single layer or a plurality of layers.

Figure 3A:
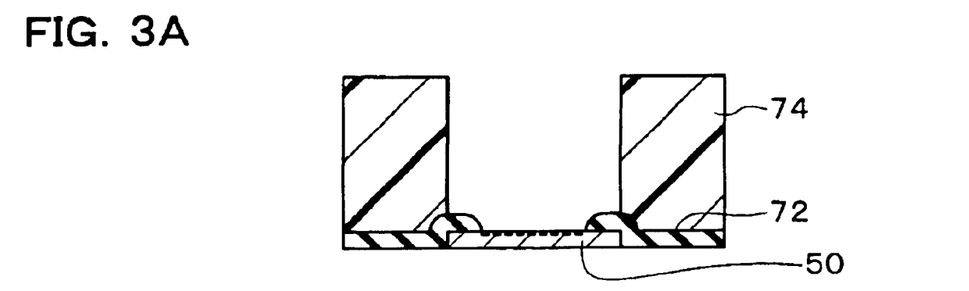
FIGS. 3A to 3D illustrate a method of manufacturing a semiconductor wafer having bumps according to the first embodiment of the present invention.

In the present embodiment, bumps are formed on the semiconductor wafer 10. In the present embodiment, bumps are formed on the pads 50 by electroless plating. As shown in FIG. 3A, a resist layer 74 is formed on the semiconductor wafer 10 (passivation film 72, for example). The resist layer 74 is formed so that part (center, for example) of the pad 50 is exposed. Specifically, an opening which exposes part of the pad 50 is formed in the resist layer 74. The resist layer 74 maybe placed on the passivation film 72 in the area which covers part (end, for example) of the pad 50. The resist layer 74 patterned in this manner controls the direction of growth of plating. Since growth of plating in the lateral direction is controlled by the resist layer 74, bumps with a small width or at a narrow pitch can be formed. The semiconductor wafer 10 has already been subjected to a cleaning step and the like.

A zincate treatment is performed in electroless plating, for example. As shown in FIG. 3A, the surface of the pads 50 is replaced by Zn by the zincate treatment. Specifically, the surface of the pads 50 is replaced by Zn according to the reaction shown by $2Al+3Zn^{2+} \rightarrow 2Al^{3+}+3Zn$.

In the present embodiment, at least two of the pads 50 are electrically connected as described above. For example, the first pad 52 which is electrically insulated from the semiconductor crystal 12 is electrically connected with the second pad 56 which is electrically connected with the semiconductor crystal 12. Therefore, since the first pad 52 and the second pad 56 are at the same potential, a significant difference in the degree of zincate treatment does not occur.

Specifically, all the pads 50 can be uniformly subjected to the zincate treatment due to a small influence of the grounding effect. Since the first pad 52 is electrically connected with the semiconductor crystal 12 only through the second path 58, electrons are rarely transferred to the semiconductor crystal 12 from the first pad 52. Moreover, since influence of the grounding effect is small, a step of applying a resist on the back side of the semiconductor wafer 10 is unnecessary. Therefore, damage to the side (main surface) of the semiconductor wafer 10 on which the pads 50 are formed, which may occur during the resist application step, can be eliminated.

The present invention does not exclude application of a resist to a side (back side, for example) other than the main surface. A zincate treatment solution may be prevented from coming in contact with the side other than the main surface by using a cup-type treatment bath which allows only the main surface to be in contact with the zincate treatment solution.

Figure 3B:
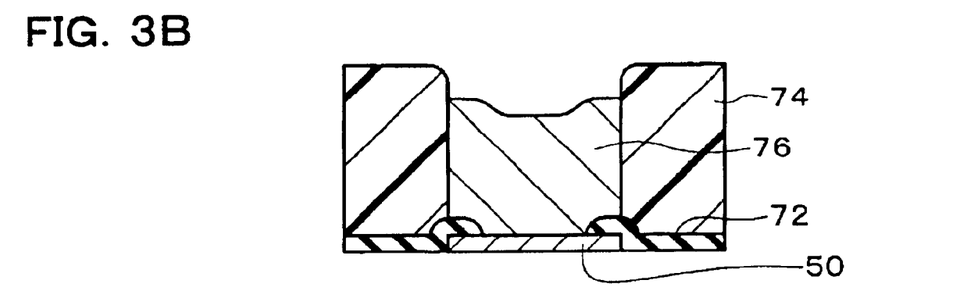

As shown in FIG. 3B, a metal (Ni, for example) is deposited. The semiconductor wafer 10 is allowed to come in contact with a treatment solution (electroless plating solution, for example). In the case of electroless plating with Ni, a replacement reaction between Zn and Ni occurs on the surface of the pads 50 subjected to the zincate treatment. Specifically, displacement plating takes place due to a difference in the ionization tendency between Ni and Zn. Ni is then deposited on Ni according to the reaction shown by $Ni^{2+}+2H_2PO_2^-\rightarrow 2H_2PO_3^-+Ni+2H+H_2$. Other details and effects are the same as those described relating to the zincate treatment. Bumps 76 are formed by uniformly plating all the pads 50 with Ni.

Figure 3C:
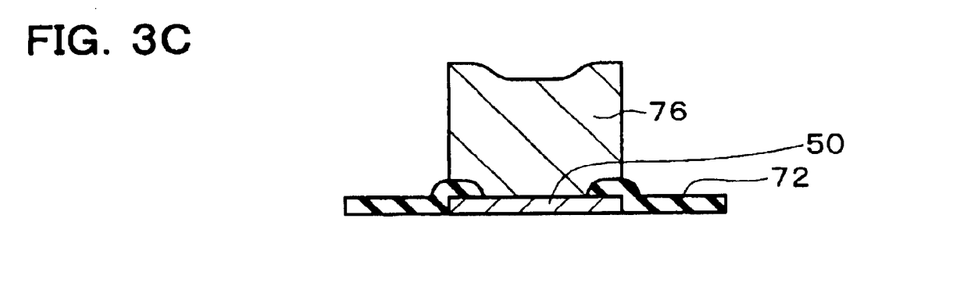
Figure 3D:
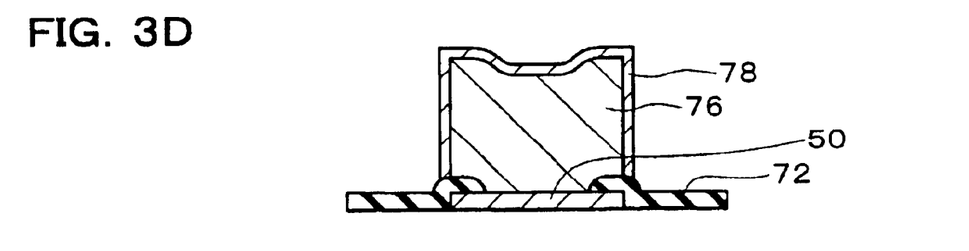

The resist layer 74 is removed as shown in FIG. 3C. As shown in FIG. 3D, another metal (Au, for example) may optionally be deposited on the bumps 76 formed of one layer on the pads 50. The semiconductor wafer 10 is allowed to come in contact with a treatment solution (electroless plating solution such as electroless Au plating solution, for example). In the case of electroless plating with Au, displacement plating shown by $3Ni+2Au^{3+}\rightarrow 3Ni^{2+}+2Au$ takes place on the surface of the bumps 76 (layer formed of Ni) due to a difference in the ionization tendency between Ni and Au. Au is then electrolessly deposited on the Au plating on the semiconductor wafer 10 by using a quinone-type reducing agent, for example. Other details and effects are the same as those described relating to the electroless plating for forming the bumps 76. A coating layer (second layer) 78 for the bumps 76 is formed by uniformly plating all the bumps 76 with Au. The coating layer 78 formed of Au not only improves electrical connection, but also contributes to an increase in tolerance against oxidation or migration of the bumps 76 formed of Ni. A semiconductor wafer having bumps can be manufactured by these steps.

Figure 4:
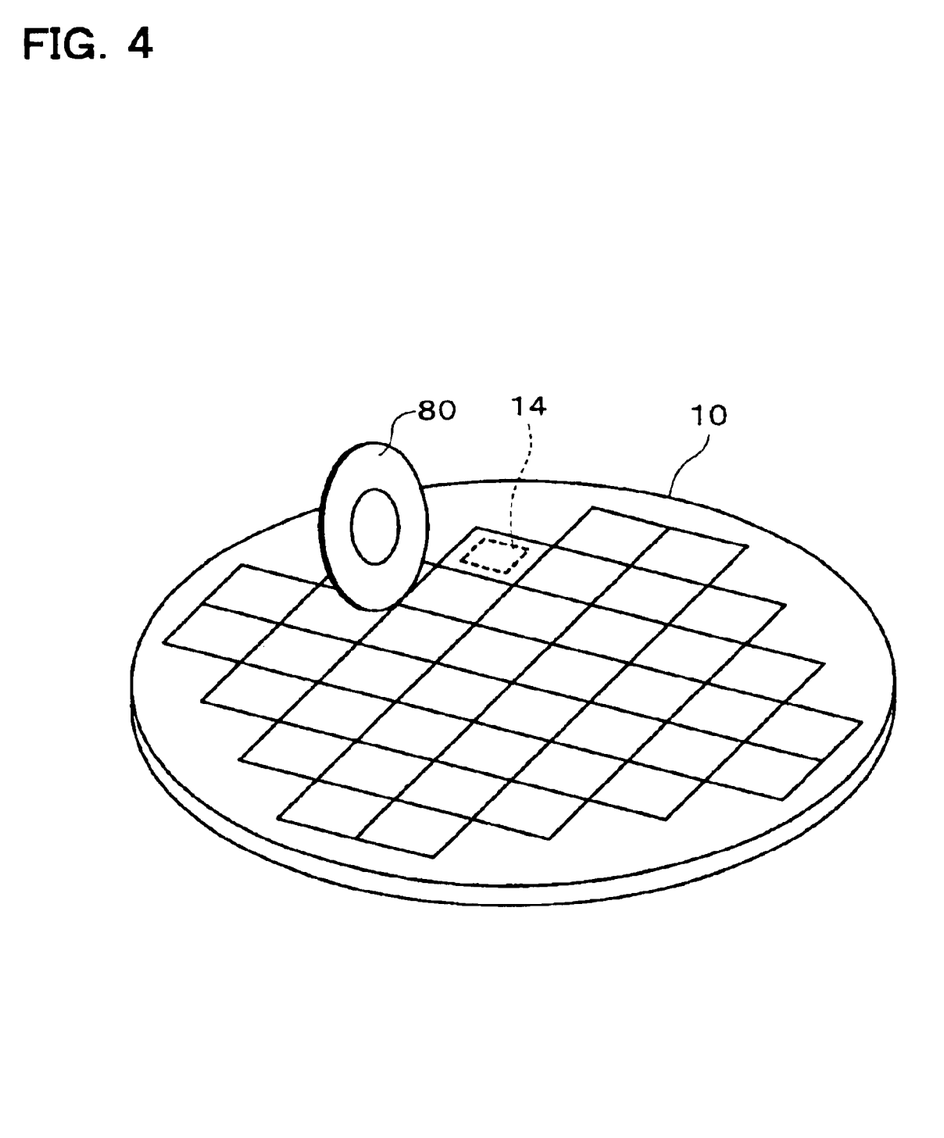
FIG. 4 illustrates a method of manufacturing a semiconductor chip having bumps according to the first embodiment of the present invention.

A method of manufacturing a semiconductor chip having bumps according to the present embodiment includes cutting the semiconductor wafer having bumps which has the above-described configuration. For example, the semiconductor wafer 10 is cut by using a tool (cutter such as dicer or scriber) 80, as shown in FIG. 4. The semiconductor wafer 10 is cut along the second region 44 (see FIG. 1). When cutting the semiconductor wafer 10, the conductor 60 shown in FIG. 2 may be removed in the second region 44 by cutting the second region 44. The entire first part 62 may be removed. Part of the first part 62 may be removed so as to cut the second part 64. Electrical connection between at least two of the pads 50 by the conductor 60 may be cut by cutting the semiconductor wafer 10. An individual semiconductor chip having bumps is obtained in this manner.

Figure 5:
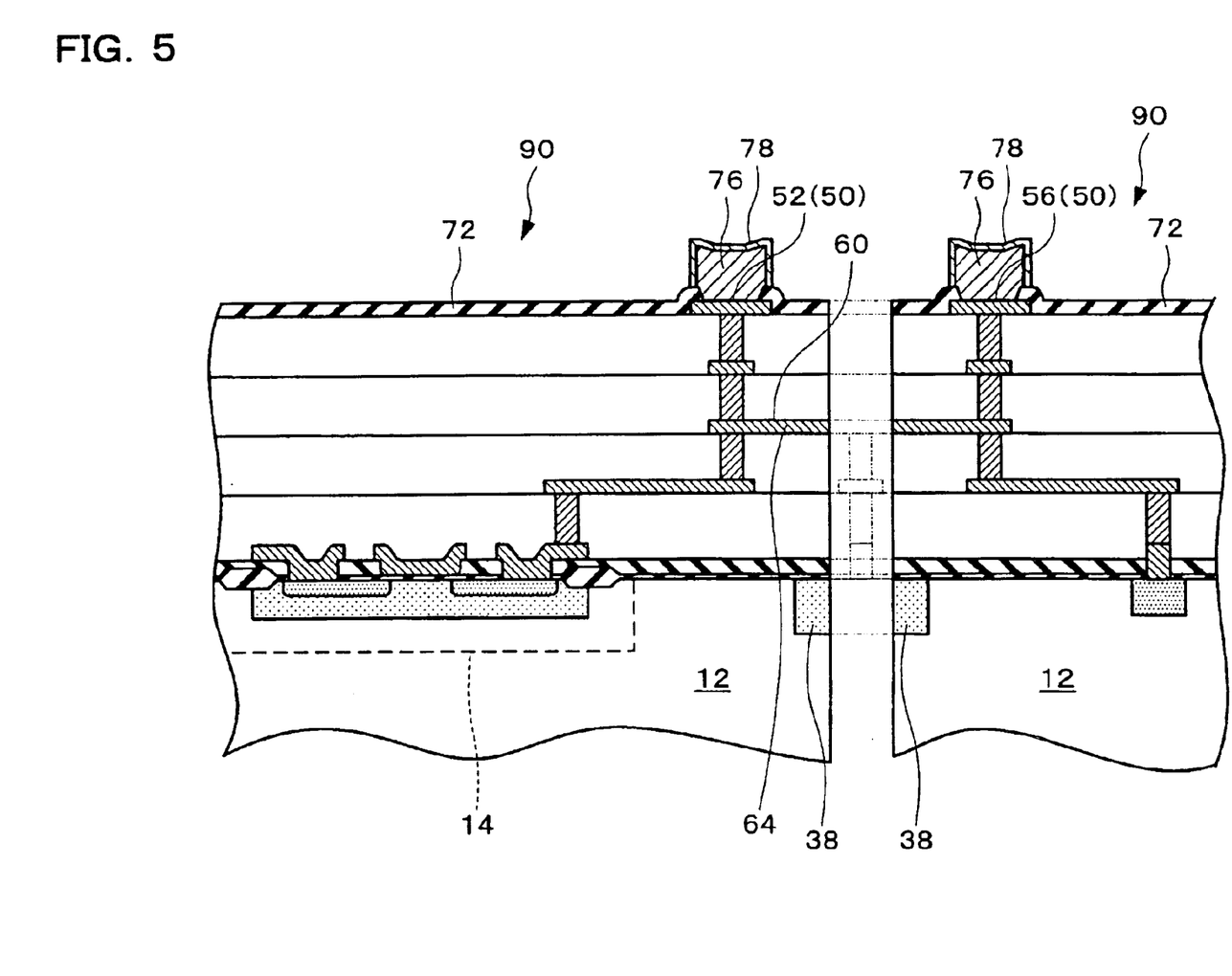
FIG. 5 shows a semiconductor chip having bumps according to the first embodiment of the present invention and a method of manufacturing the same.

FIG. 5 is a view showing semiconductor chips having bumps manufactured by the above-described method. A semiconductor chip 90 has a structure in the first region 42 of the semiconductor wafer 10. The bump 76 is provided on the pad 50 and the coating layer 78 is formed on the surface of the bump 76. The details are the same as described above.

A section of the conductor 60 (second part 64, for example) is exposed on the semiconductor chip 90. Since the part (second part 64, for example) of the conductor 60 which passes through the second region 44 is formed in a layer lower than the pad 50, a path line which connects the exposed side and the pad 50 is increased, whereby migration to the pad 50 can be prevented. A section of the impurity diffusion region 38 may be exposed in the semiconductor chip 90.

Figure 6:
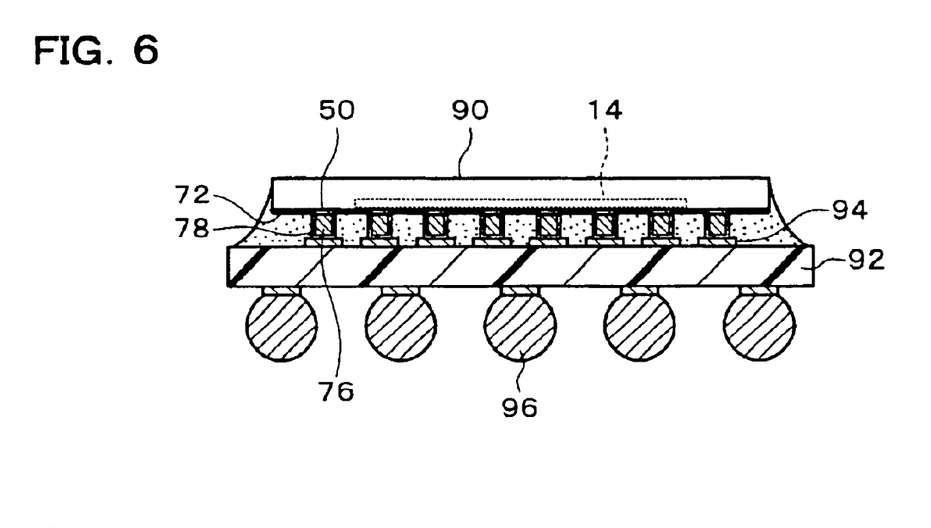
FIG. 6 shows a semiconductor device according to the first embodiment of the present invention.

FIG. 6 is a view showing a semiconductor device according to the present embodiment. The semiconductor device includes the semiconductor chip 90. The semiconductor chip 90 is mounted (bonded face down, for example) on a substrate (ceramic substrate or flexible substrate, for example) 92. An interconnect pattern 94 is formed on the substrate 92. The interconnect pattern 94 and the bumps 76 are electrically connected. An anisotropic conductive material (anisotropic conductive film or anisotropic conductive paste) or a conductive material (conductive paste or the like) may be used for the electrical connection. In addition, a metal junction may be applied or an insulating adhesive may be used. External terminals (solder balls, for example) 96 may be provided on the substrate 92.

Figure 7:
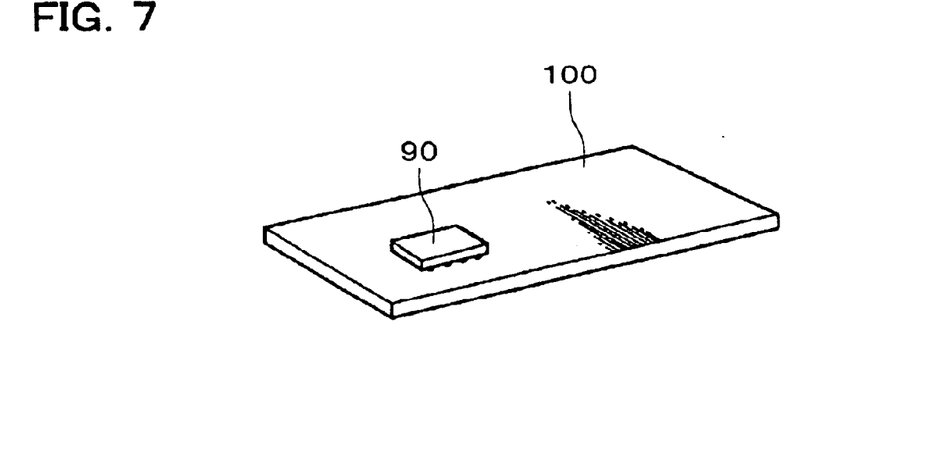
FIG. 7 shows a circuit board equipped with the semiconductor chip having bumps according to an embodiment of the present invention.

FIG. 7 is a view showing a circuit board equipped with the semiconductor chip having bumps according to the present embodiment. The semiconductor chip 90 is mounted (flip-chip bonded, for example) on a circuit board (motherboard) 100. An interconnect pattern (not shown) is formed on the circuit board 100.

Figure 8:
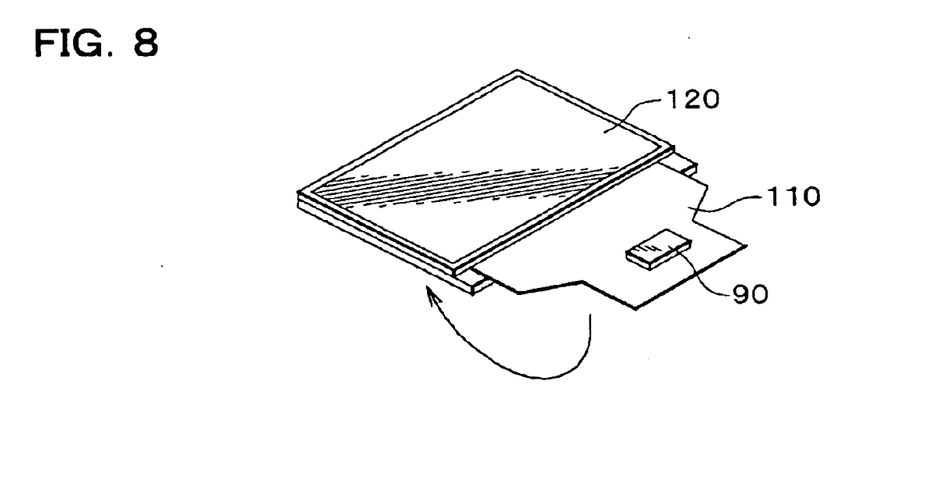
FIG. 8 shows a semiconductor device equipped with a semiconductor chip according to an embodiment of the present invention.

FIG. 8 is a view showing a semiconductor device equipped with the semiconductor chip according to the present embodiment. In the semiconductor device, the semiconductor chip 90 is mounted on a substrate 110 to make up a TCP (Tape Carrier Package). This semiconductor device is bonded to an electronic panel (liquid crystal panel or electroluminescent panel, for example) 120. The mounting form of the semiconductor chip 90 may be COG (Chip On Glass) or COF (Chip On Film/Flexible).

Figure 9:
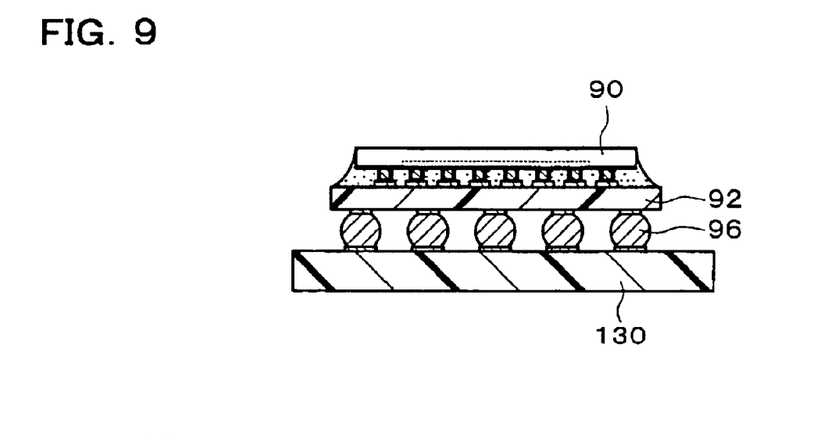
FIG. 9 shows a circuit board equipped with the semiconductor device shown in FIG. 6.
Figure 10:
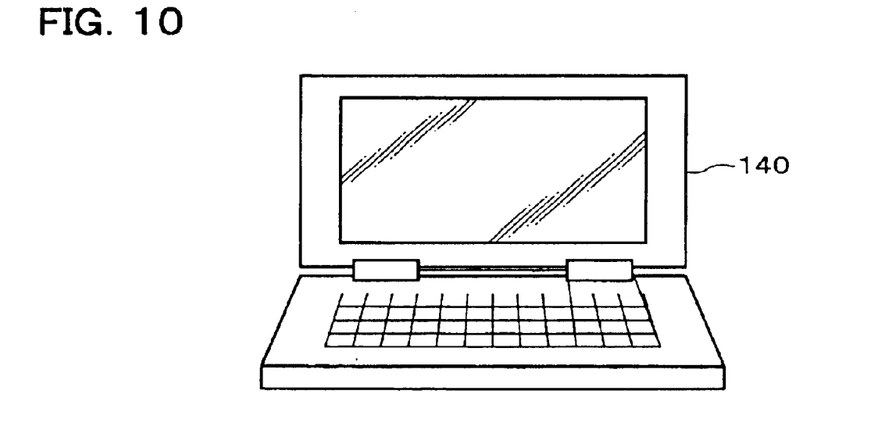
FIG. 10 shows electronic equipment including a semiconductor device according to an embodiment of the present invention.
Figure 11:
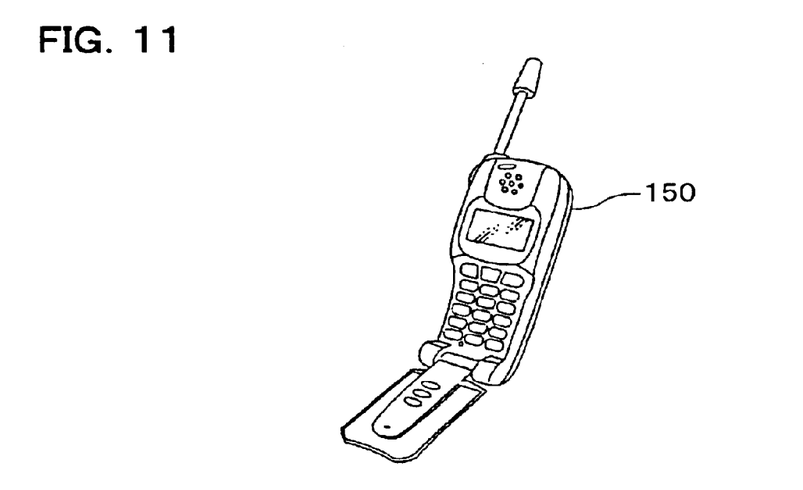
FIG. 11 shows electronic equipment including a semiconductor device according to an embodiment of the present invention.

FIG. 9 shows a circuit board 130 equipped with the semiconductor device shown in FIG. 6. FIGS. 10 and 11 respectively show a notebook-type personal computer 140 and a portable telephone 150 as examples of electronic equipment including the semiconductor device to which the present invention is applied.

Second Embodiment

Figure 12:
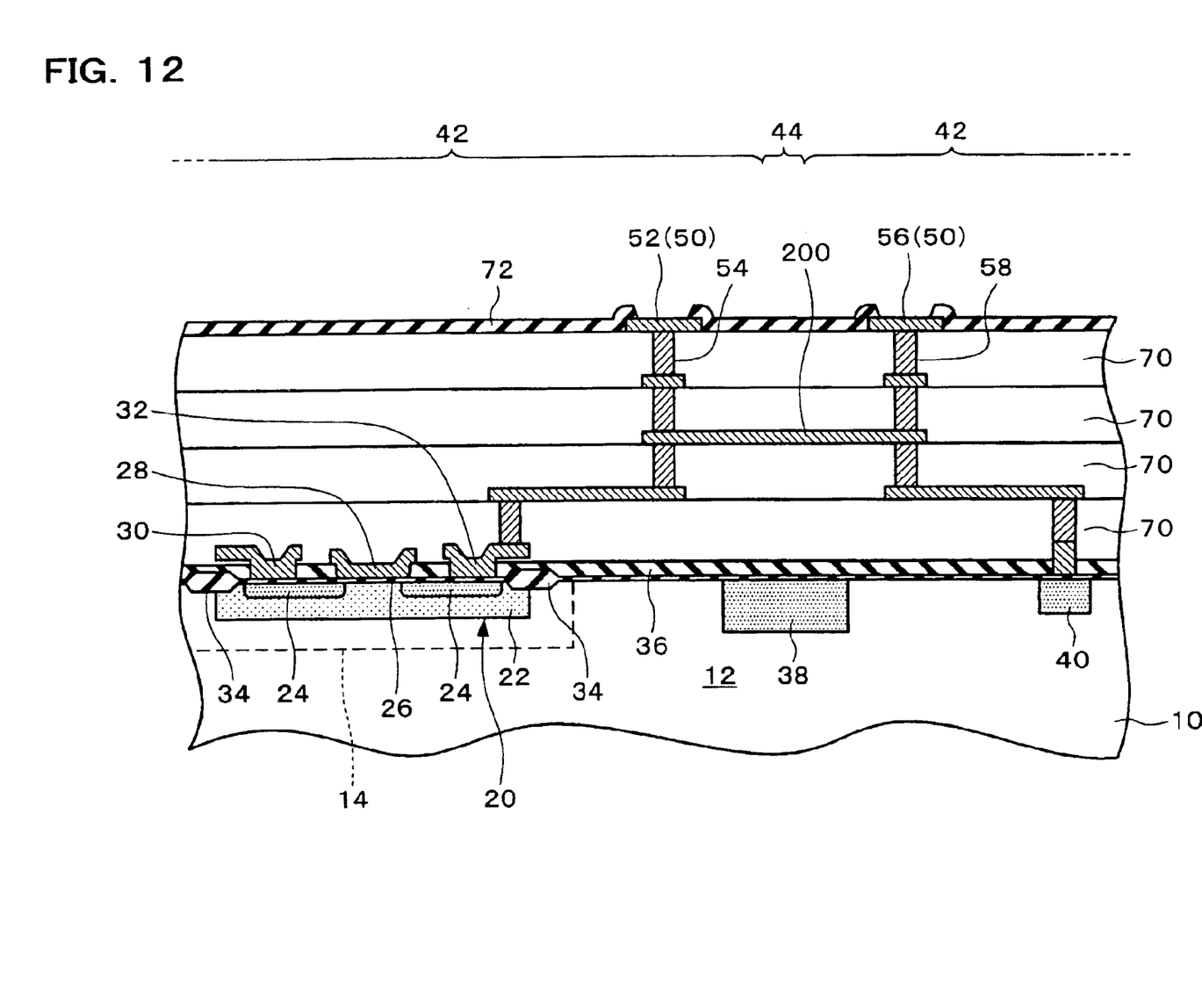
FIG. 12 shows a semiconductor wafer according to a second embodiment of the present invention.

FIG. 12 is a view showing a semiconductor wafer according to a second embodiment of the present invention. In the present embodiment, a conductor 200 and the semiconductor crystal 12 are electrically insulated by an electric insulator (insulating films 26 and 36 and insulating layer 70, for example) formed on the semiconductor crystal 12. The description of the first embodiment applies to the present embodiment excluding this feature. In the present embodiment, the effects described in the first embodiment can also be achieved.

Third Embodiment

Figure 13A:
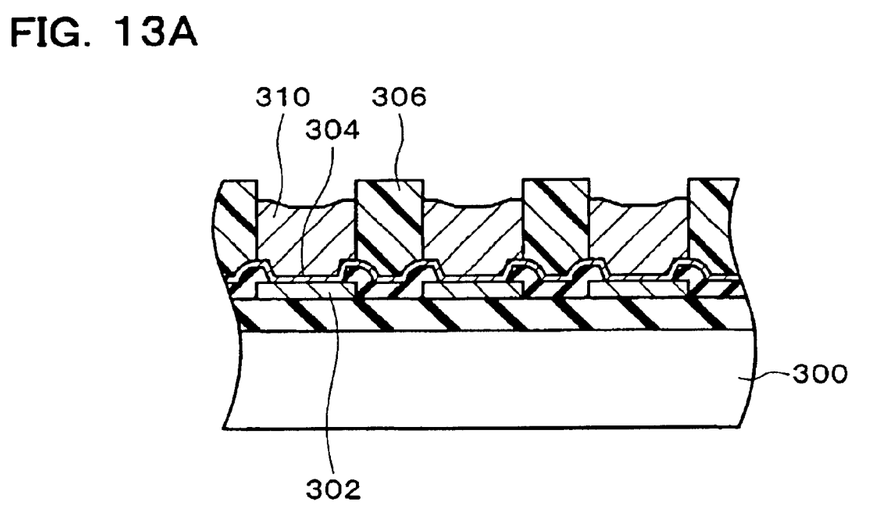
FIGS. 13A and 13B illustrate a method of manufacturing a semiconductor wafer having bumps according to a third embodiment of the present invention.
Figure 13B:
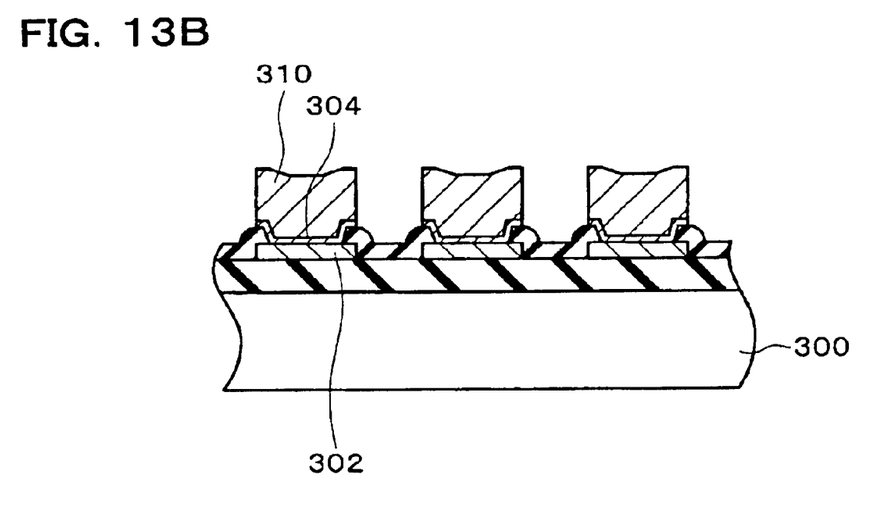

FIGS. 13A and 13B are views illustrating a method of manufacturing a semiconductor wafer having bumps according to a third embodiment of the present invention. A semiconductor wafer 300 used in the present embodiment has a structure in which the conductor 60 and the impurity diffusion region 38 are removed from the semiconductor wafer 10 shown in FIG. 2. A conductive film 304 is formed on a plurality of pads 302 of the semiconductor wafer 300 so as to electrically connect at least two of pads 302. Bumps 310 are formed on the conductive film 304 located on the pads 302 by electroless plating. The conductive film 304 may be an under-bump metal.

In more detail, a patterned resist layer 306 is formed as shown in FIG. 13A. The bumps 310 are formed by electroless plating. The details are the same as described in the first embodiment. As shown in FIG. 13B, the resist layer 306 is removed and the conductive film 304 is etched using the bumps 310 as a mask. This enables electrical connection between the bumps 310 to be cut.

In the present embodiment, since the electroless plating is performed while electrically connecting at least two of the pads 302, influence of the grounding effect can be reduced as described in the first embodiment. The features of the present embodiment may be applied to other embodiments.

Fourth Embodiment

Figure 14:
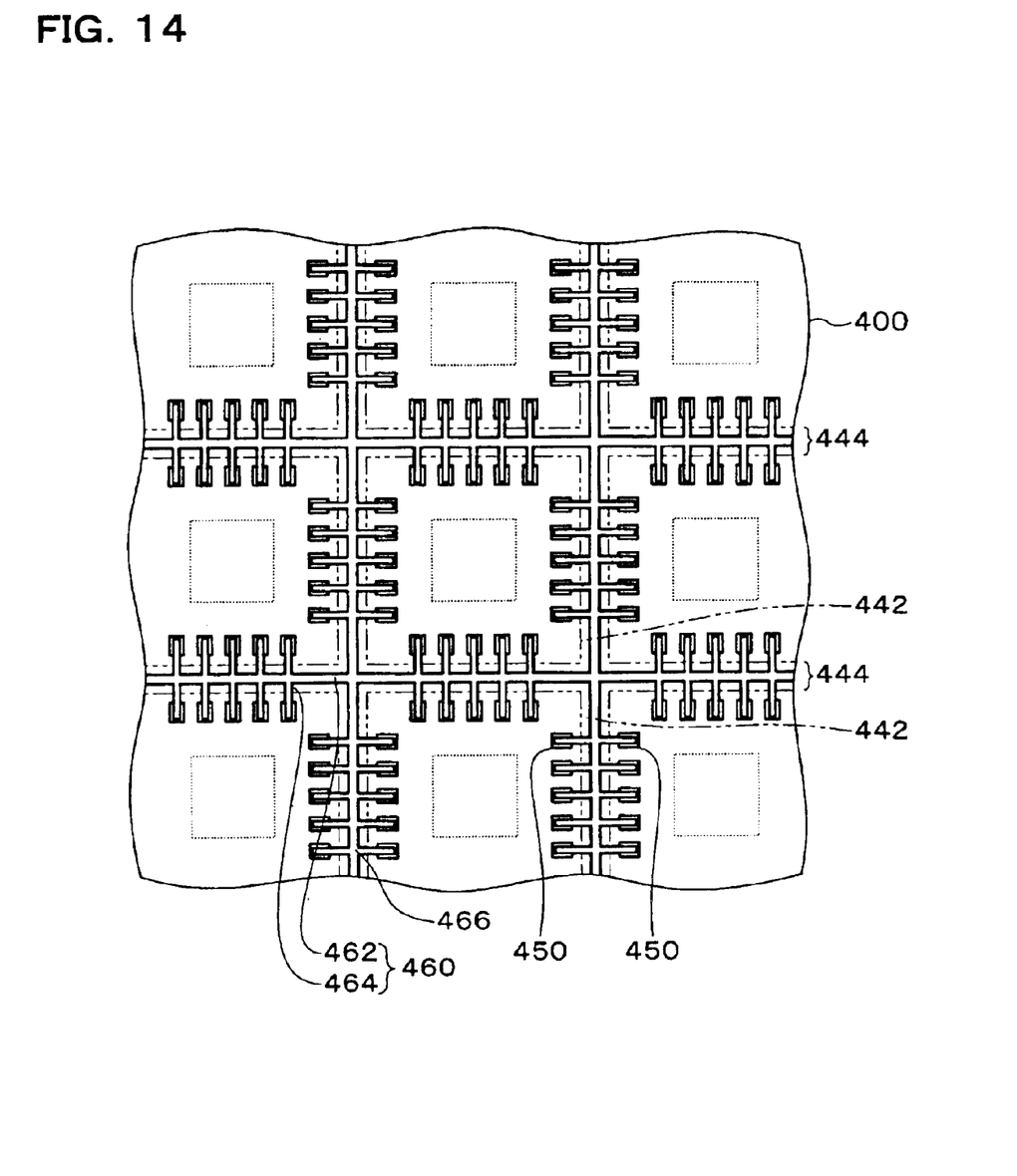
FIG. 14 shows a semiconductor wafer according to a fourth embodiment of the present invention.
Figure 15:
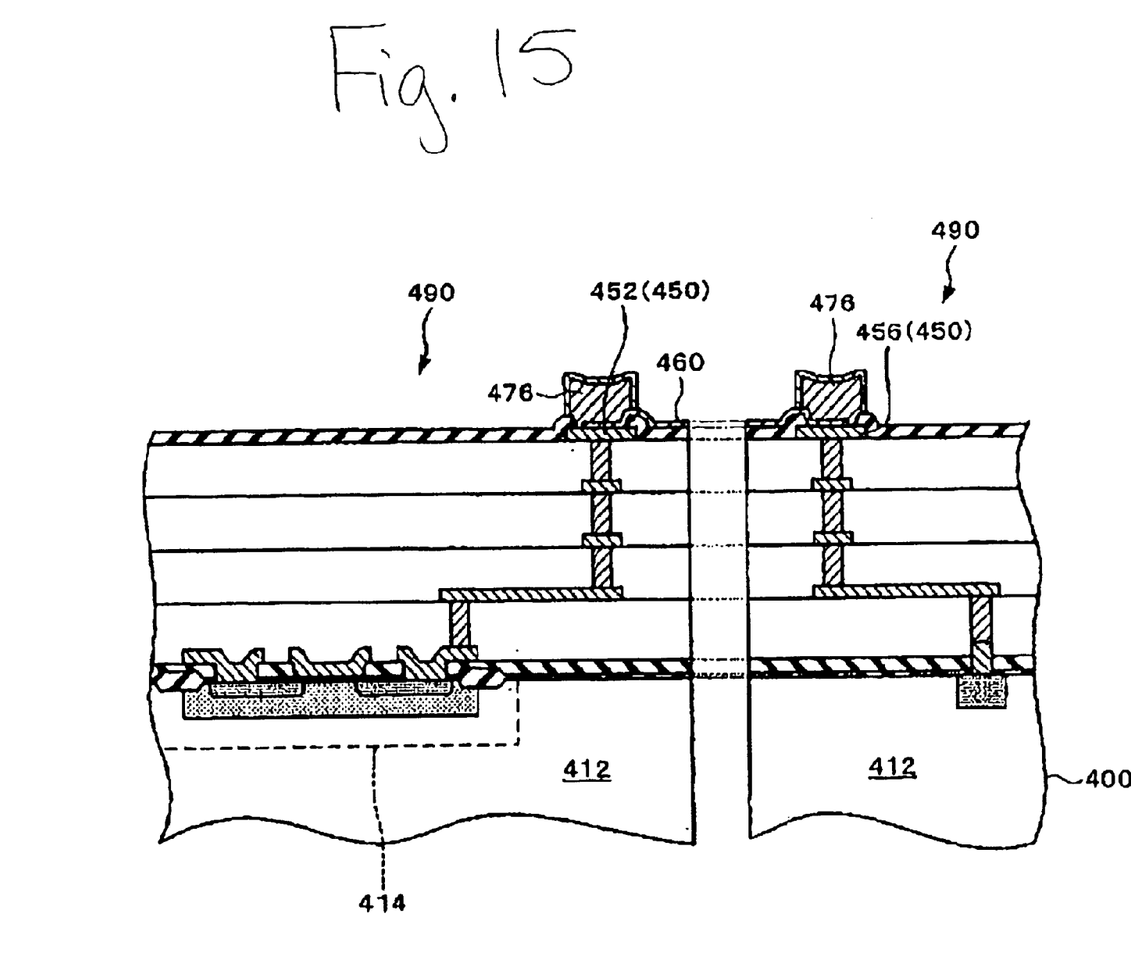
FIG. 15 illustrates a method of manufacturing a semiconductor wafer having bumps and a method of manufacturing a semiconductor chip having bumps according to the fourth embodiment of the present invention.

FIG. 14 is a view showing a semiconductor wafer according to a fourth embodiment of the present invention. FIG. 15 is a view illustrating a method of manufacturing a semiconductor wafer having bumps and a method of manufacturing a semiconductor chip having bumps according to the fourth embodiment of the present invention.

A semiconductor wafer 400 has a structure in which the conductor 60 and the impurity diffusion region 38 are removed from the semiconductor wafer 10 shown in FIG. 2. For example, the semiconductor wafer 400 includes a plurality of monolithic integrated circuits 414 formed on a semiconductor crystal 412 for realizing a function of a plurality of semiconductor chips. The semiconductor wafer 400 includes a plurality of pads 450 formed in a plurality of first regions 442 which become a plurality of semiconductor chips.

The semiconductor wafer 400 includes a conductive film 460. The conductive film 460 is formed instead of the conductor 60 described in the first embodiment. The conductive film 460 may have the same functions as the conductor 60. For example, the conductive film 460 is formed to pass through a second region 444 between two first regions 442. The conductive film 460 is formed on a plurality of the pads 450 so as to electrically connect at least two of the pads 450 (a first pad 452 electrically connected with the monolithic integrated circuit 414 and a second pad 456 electrically connected with the semiconductor crystal 412, for example).

The conductive film 460 may have branched sections 466 connected with at least two of the electrically connected pads 450 in the second region 444. The conductive film 460 may have a first part 462. The first part 462 may be formed along the second region 444 and inside the second region 444 so as to enclose each of the first regions 442. The conductive film 460 may have a plurality of second parts 464. Each of the second parts 464 electrically connects a pair of pads 450 adjacent with the second region 444 interposed therebetween. The second part 464 may be electrically connected with the first part 462. The conductive film 460 may be formed so that at least two of the pads 450 are electrically isolated when the portion in the second region 460 is cut.

In the semiconductor wafer 400, bumps 476 (see FIG. 15) may be formed on the conductive film 460 located on the pads 450. The formation method for the bumps 476 is the same as the method described in the first embodiment. The conductive film 460 may be an under-bump metal.

A semiconductor chip having bumps is manufactured by cutting the semiconductor wafer 400, as shown in FIG. 15. The details are the same as described in the first embodiment. In a semiconductor chip 490 having bumps shown in FIG. 15, a section of the conductive film 460 is exposed.

In the present embodiment, since the electroless plating is performed while electrically connecting at least two of the pads 450, influence of the grounding effect can be reduced as described in the first embodiment. The features of the present embodiment may be applied to other embodiments.

The present invention is not limited to the above-described embodiments and various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A semiconductor wafer comprising:

a plurality of monolithic integrated circuits formed in a semiconductor crystal for realizing a function of a plurality of semiconductor chips;

a plurality of pads formed in a plurality of first regions to be the plurality of semiconductor chips; and a conductive film formed on the pads semiconductor wafer through a second region, which is located between two of the first regions, and electrically connecting at least two of the pads, wherein the conductive film has a first part and a plurality of second parts, wherein the first part is formed along and inside the second region so as to enclose each of the first regions, and wherein each of the second parts electrically connects a pair of the pads adjacent to each other across the second region, the second parts electrically connected with the first part, a part of each of the second parts formed on the pads.

2. The semiconductor wafer as defined by claim 1, wherein a conductive film has a branch section connected with each of the at least two of the electrically connected pads in the second region.

3. The semiconductor wafer as defined by claim 1, further comprising:

bumps formed on the conductive film in a region over the respective pads.

* * * * *